United States Patent [19]

Goetz et al.

[11] Patent Number: 6,124,039
[45] Date of Patent: Sep. 26, 2000

[54] COATING SUBSTRATE

[75] Inventors: Michael Goetz, Neuchâtel; Walter Hotz, Beringen; Herbert Keppner, Colombier, all of Switzerland

[73] Assignee: Alusuisse Technology & Management Ltd., Neuhausen am Rheinfall, Switzerland

[21] Appl. No.: 09/155,702

[22] PCT Filed: Mar. 27, 1997

[86] PCT No.: PCT/CH97/00130

§ 371 Date: Oct. 5, 1998

§ 102(e) Date: Oct. 5, 1998

[87] PCT Pub. No.: WO97/38145

PCT Pub. Date: Oct. 16, 1997

[30] Foreign Application Priority Data

Apr. 3, 1996 [CH] Switzerland .............. 0865/96

[51] Int. Cl.$^7$ .................................... B32B 3/00
[52] U.S. Cl. ............... 428/457; 428/469; 428/472.2; 428/650; 428/654; 428/689; 216/102
[58] Field of Search .................. 428/457, 469, 428/472.2, 615, 650, 654, 688, 689, 699, 702; 216/11, 52, 102

[56] References Cited

U.S. PATENT DOCUMENTS

| | | | |
|---|---|---|---|
| 5,723,221 | 3/1998 | Brooker | 428/469 |
| 5,760,981 | 6/1998 | Gillich | 359/883 |
| 5,779,871 | 7/1998 | Gillich | 205/116 |
| 5,904,989 | 5/1999 | Hanggi | 428/457 |

FOREIGN PATENT DOCUMENTS

| | | |
|---|---|---|
| 155 758 | 9/1985 | European Pat. Off. . |
| 478 010A2 | 4/1992 | European Pat. Off. . |
| 478 010B1 | 4/1992 | European Pat. Off. . |
| 495 755 | 7/1992 | European Pat. Off. . |
| 35 28 087 | 2/1986 | Germany . |

OTHER PUBLICATIONS

Extended Abstracts vol. 86, No. 1, Princeton, NJ, May 1986, p. 59, Abstract No. 46, H. Takei, et al., "Application of textured aluminum foil to amorphous silicon solar cell substrate".

*Primary Examiner*—Elizabeth Evans
*Attorney, Agent, or Firm*—Cohen, Pontani, Lieberman & Pavane

[57] ABSTRACT

A coating substrate containing an aluminum or aluminum rolled alloy product for thin-film coatings for producing electronic components. The coating substrate prevents the interdiffusion of substrate elements and thin-film coating elements and enables the thin-film coatings to grow completely over irregularities. The local irregularities on the substrate surface to be coated, which have a maximum extension, measured vertically to the substrate surface, of less than 10 um and than 0.1 um, are such that the flanks of the local irregularities can be exposed to material deposition impinging on the substrate surface in a perpendicular manner.

25 Claims, No Drawings

COATING SUBSTRATE

BACKGROUND OF THE INVENTION

1. Field of the Invention

The present invention relates to a coating substrate for thin-film coatings used in the manufacture of electronic components, said coating substrate containing a rolled product of aluminium or aluminium alloys, and being such that the substrate surface to be coated exhibits local irregularities in the structure in the form of small holes or small-grained or needle-shaped elements in the substrate surface. Further, the present invention relates to a process for manufacturing the coating substrate. In addition, the use of the coating substrate according to the invention is described.

2. Discussion of the Prior Art

The term electronic components includes e.g. electronic thin-film components such as diodes or transistors, in particular solar cells. The economic use of such electronic components depends essentially on the cost of manufacturing them.

By using thin-film technology, materials savings can be made in the manufacture of such electronic components and, by using continuous coating methods, large quantities can be made at favourable cost. As far as solar cell manufacture is concerned, this involves essentially solar cells of amorphous silicon (a-Si), or microcrystalline silicon ($\mu$c-Si), or multiple cells of both or one of the two mentioned materials. Compared with solar cells of crystalline silicon which are made in batch processes e.g. on silicon wafers, such solar cells exhibit lower efficiency, but the cost of manufacture is much more favourable than that of solar cells made of crystalline silicon. Because of the lower efficiency of solar cells made from a-Si or $\mu$c-Si—compared with solar cells made from crystalline silicon—large area, cost favourable modules are necessary in order to be able to use them economically.

The production of solar cells of a-Si or $\mu$c-Si on glass substrates or foils of stainless steel is known.

Extended Abstracts, Vol. 86, No. 1, May 1986, p. 59 describes the manufacture of an a-Si solar cell of high purity (99.99 wt. %) in which the aluminium substrates are cleaned chemically and a repetitive surface structure is etched into the surface layer of the aluminium substrate by means of electrochemical methods in order to achieve multiple reflection of the incident light.

The publication EP-A-O 155 758 describes substrates with a light-sensetive composite layer containing a-Si for digital imaging using coherent laser-beam light in which, in order to avoid interference due to variations in layer thickness, the composite layer is made up in such a manner that at least one pair of non-parallel interfaces is produced between the layers, so that a layer with a continuously changing layer thickness is produced between these interfaces.

Up to now—because of the much higher efficiency, and hence smaller surface area required mono or polycrystalline silicon solar cells have been almost exclusively employed for photovoltaic energy-producing units that have been installed individually e.g. mounted on roofs or as free-standing units.

However, solar cells of a-Si or $\mu$c-Si exhibit large potential in integral photovoltaic units for which a support surface is already provided for the solar cells. Especially in the construction of photovoltaic facade elements solar cell modules of a-Si or $\mu$c-Si can be deposited over large areas directly onto the facade element using plasma-deposition, CVD (chemical vapour deposition) and PVD (physical vapour deposition) processes. As a result, a photovoltaic module of a-Si or $\mu$c-Si deposited directly onto a facade element requires only approximately a quarter of the primary energy necessary to manufacture a corresponding module of crystalline silicon.

The potential for large area solar cells of a-Si or $\mu$c-Si is therefore enormous. Such solar cells can be employed in buildings e.g. as facade elements, or in vehicle manufacture e.g. as bodywork cladding, and contribute significantly to the generation of electricity.

However, the production of electronic components using thin-film technology requires a suitable substrate to be made available for that purpose. In particular, the production of large area photovoltaic solar cells requires cost-favourable substrates with surface properties that are adequate for thin-film coating purposes.

For reasons of costs and weight, large area aluminium panels or composite panels with aluminium outer layers are widely used today. For that reason, depositing solar cells on substrates of aluminium or aluminium alloys by thin-film technology could strongly favour the economic exploitation of solar energy via photovoltaic units.

A significant additional advantage to be obtained from the use of aluminium coating substrates is the ductility of aluminium and its alloys. The ductility of that material permits easy rolling and therefore cost-favourable manufacture of large area substrates and, also allows the substrate surface to be embossed, in particular by rolling. The embossing enables optimised surface structures to be made for specific purposes e.g. inverted pyramids or saw tooth structures in the sub-micron to millimeter range, for example for photovoltaic applications.

Known from the field of semiconductor technology is that aluminium and silicon can react on coming into direct contact with each other, various reactions taking place already below 200° C. The use of aluminium substrates in thin film technology usually requires therefore the deposition of a diffusion barrier layer and/or insulating layer. In order to prevent the interdiffusion of aluminium and silicon, up to now various effective, but complicated and expensive diffusion barrier layers have been made in tests. For large area and cost favourable photovoltaic modules, however, diffusion barrier layers out of complicated multilayer systems have to be avoided. Also such a diffusion barrier layer should not involve the incorporation of any expensive materials. A further requirement regarding diffusion barriers concerns the compatibility of the method of their manufacture and materials with the substrate body material and the production of the substrate.

The use of aluminium as a substrate material for thin film solar cells of a-Si or $\mu$c-Si is described in DE 35 28 087, the substrate surface being given an oxide layer as barrier and insulating layer in the form by anodising in oxalic acid. In that case aluminium substrates of high purity are necessary to produce the anodic oxide layer.

Especially when depositing very thin layers in the gas phase, e.g. plasma deposition of a-Si or $\mu$c-Si, it has been found that surfaces, e.g. aluminium substrates featuring an anodic oxide layer exhibit surfaces, in which interdiffusion of aluminium and silicon occurs and/or exhibit locally defective sites which lead to short circuiting, can lead to a breakdown in the whole thin layer module. The above mentioned problems appear especially when employing commercially available aluminium substrates out of pure aluminium or aluminium alloys.

The economic manufacture of thin film semiconductor elements normally requires the silicon layers to be deposited by plasma deposition as this enables layers to be produced at low substrate temperatures. By way of contrast, other thin film solar cell technologies such as e.g. CIS (copper indium diselenide) or CIGS (copper indium gallium diselenide) are unsuitable for aluminium substrates as they require temperatures close to the melting point of aluminium. Although plasma deposition takes place at low substrate temperatures, the substrate surface can become heated very locally at specific sites (grain or needle-shaped surface structures which make poor thermal contact with the substrate) leading, as a result, to plasma induced interdiffusion of e.g. aluminium and silicon. Thereby it should be noted that the temperature of the substrate surface is not, or only insignificantly, increased by the plasma deposition process, as an increase in the kinetic energy of some surface atoms as a result of ion bombardment can not be regarded as an increase in temperature in the classical sense.

SUMMARY AND DISCUSSION OF THE INVENTION

The object of the present invention is to provide a cost-favourable coating substrate—for thin film coatings to manufacture electronic components—which avoids the above mentioned dis-advantages arising with state of the art substrates.

That objective is achieved by way of the invention in that in order to avoid defects in the electronic components, all local irregularities on the substrate surface to be coated having a maximum extension, measured vertically to the substrate surface, of less than 10 μm and more than 0.1 μm, are such that:

a) the flanks of the local irregularities can be exposed completely to material deposition impinging on the substrate surface in a perpendicular manner, and b) the maximum extension of each local irregularity, measured parallel to the substrate surface, is larger or equal to the corresponding extension in the vertical direction.

Within the scope of the activities relating to the invention it has been found that in order to avoid short circuiting in the thin film elements deposited on the aluminium substrate and/or to avoid the interdiffusion of substrate elements and coating elements, the choice of a suitable anti-diffusion material or barrier layer material alone is not sufficient. More important for an adequate diffusion barrier is the choice of the anti-diffusion material in conjunction with the coating process and the substrate surface to be coated, as the diffusion occurs preferably at grain boundaries and a points of defect in the boundary layer. Further, it has been found that the interdiffusion of substrate elements and semiconductor elements during e.g. a plasma deposition process is promoted strongly by the presence of local irregularities such as small holes in the substrate surface or small grained elements of the substrate surface, especially when these exhibit sharp edges and corners. Thereby it should be noted that such irregularities normally make only little thermal contact with the substrate body, so that the energy supplied by ions during e.g. plasma deposition can be transmitted only poorly to the substrate body and, as a result, leads to very pronounced local overheating of the substrate surface. The local overheating then leads to an acceleration of interdiffusion of substrate material elements and coating elements.

All local irregularities in the coating substrate according to the invention preferably exhibit a maximum extension, measured vertically from the substrate surface, which is less than 10 μm and more than 0.1 μm. The maximum extension of each local irregularity measured parallel to the substrate surface is preferably larger than or equal to the corresponding vertical extension.

Further, the angle between each normal on the flank of each feature of irregularity and the surface normals of the substrate surrounding the local irregularity is preferably from 0 to 88°, referring to a full circle of 360°. The peak-shaped parts of the local irregularities of the sub-strate according to the invention preferably exhibit a radius of curvature greater than 0.2 μm.

With respect to the production of thin-film semiconductor elements, especially with their large area, the coating substrate surface according to the invention prevents or at least reduces the interdiffusion of substrate elements and coating elements. In addition, the substrate according to the invention makes it possible to cover over the local irregularities by the thin-film layers that are deposited; this in turn prevents short circuiting in the thin-film components deposited on the substrate.

The coating substrate e.g. is a sheet-like, rolled substrate of aluminium or its alloys. Preferred are sheets, strips or foils of aluminium or its alloys. The substrates may, however, be bodies of any desired shape having an aluminium surface or a surface containing aluminium. The substrate may also be a composite material, at least the outer layer of which is of aluminium or an aluminium alloy. A coating substrate may therefore feature a surface layer of pure aluminium, containing essentially aluminium and the normal commercial grade impurities, or may be of aluminium alloys.

Substrates of pure aluminium may e.g. be an aluminium having a purity of 98.3 wt. % and higher, preferably 99.0 wt. % and higher and especially from 99.5 to 99.98 wt. %, the rest being commercially occurring impurities.

Wrought aluminium alloys are preferred for substrates of aluminium alloys. Among these are for example alloys of the types: AlMg, AlMn, AlMgSi, AlCuMg and AlZnMg.

Wrought aluminium alloys may contain e.g.: up to 1.5 wt. % silicon, up to 1.0 wt. % iron, up to 4.0 wt. % copper, up to 1.5 wt. % manganese, up to 6.0 wt. % magnesium, up to 7.0 wt. % zinc, up to 0.2 wt. % titanium, and up to 1.6 wt. % of other elements, the remainder being aluminium. Preferred are substrates of aluminium containing: 0.25 to 1.5 wt. % silicon, up to 0.3 wt. % iron, up to 0.25 wt. % copper, 0.1 to 0.8 wt. % manganese, 2.7 to 5.0 wt. % magnesium, up to 1.0 wt. % zinc, 0.01 to 0.2 wt. % titanium, up to 0.2 wt. % chromium, and up to 1.5 wt. % of other elements, the remainder being aluminium.

Examples of aluminium substrate alloys used in practice are AlMg3, AlMg3Si, AlMg5, AlMg5Si, AlMg10 and AlMgSi1.

Useful as coating substrates are 5 μm to 1.5 mm thick foils, in particular 5 μm to 20 μm thick foils, or 0.5 to 50 mm thick strips or sheets. Preferred are aluminium sheets, strips or foils of thickness 0.01 mm to 5 mm, and in particular 0.05 mm to 3 mm.

The substrates according to the invention permit thin-film systems—such as intended for solar modules—to be deposited directly onto aluminium surfaces. This makes possible e.g. the direct build up of photovoltaic modules on facade panels of commercially available aluminium or of commercially available composite panels with aluminium outer layers (e.g. plastic core and honeycomb core panels). Such photovoltaic facade elements satisfy the normal, high standard of requirements of the building industry and fire protection, whereby in the case of fire the silicon solar cells in particular release no poisonous materials. Further, the production, operation and the disposal of photovoltaic modules on aluminium substrates presents no ecological problems.

Facade elements with directly deposited thin-film solar cells make it possible to use of facades for generating energy economically, at the same time reducing the costs for installing and sealing solar modules. Such facade elements may be employed in hybrid modes i.e. they can be used as solar collector panels, sun-shades and as solar cells.

In a preferred version the substrate according to the invention features on or in the substrate surface to be coated at least partially an embossed type of structure. The embossed structure may be decorative in appearance or may be of such a form that it is possible to reflect the incident electromagnetic radiation, in particular light, in a predetermined direction.

The production of the embossed structure takes place preferably by use of embossed rolls, whereby e.g. in the production of the rolled substrate, the last rolling pass is performed using a roll with a surface exhibiting the desired structure; or by structuring the coating.

Decorative embossed structures may contain logos, advertising texts, trade marks, company names or patterns, whereby embossed patterns may also be used e.g. to increase the difficulty of copying without permission. Such embossed structures exhibit usefully a depth of structure of 1 nm to 1 $\mu$m, preferably between 10 nm and 0.5 $\mu$m. By the term depth of structure is meant the maximum difference in height between structure valley and structure height.

Embossed structures for purposeful deflection or scattering of electromagnetic radiation in a predetermined range of angle may be employed e.g. to increase the efficiency of the solar cells. Such embossed structures exhibit usefully depths of structure of 0.5 $\mu$m to 2 mm, preferably from 10 $\mu$m to 1 mm.

The embossed patterns may have any desired shape. The largest dimension of the individual elements of embossed structure parallel to the substrate surface is usefully from 1 nm to 5 mm, preferably between 10 nm and 2 mm.

In photovoltaic applications the embossed structure is preferably a saw-tooth pattern with V-shaped troughs. The flanks of the V-shaped troughs are preferably such that during the day, at all times of the year, the sun shines on both flanks. For use in regions not close to the equator these V-shaped troughs are, therefore, preferably asymmetric in shape. For applications e.g. in regions in central Europe the V-shaped troughs are e.g. shaped such that with respect to the surface normals of the facade element one flank exhibits an angle of ca. 5 to 10° and the other flank an angle of 50 to 60° (Angles referring always to a full circle of 360°). The size of structure of the V-shaped troughs is usefully in the millimeter or submillimeter range.

Embossed surface structures, such as e.g. structures in the form of inverted pyramids or surface structures with saw-tooth patterns, increase e.g. in the case of photovoltaic modules the effective thickness of the solar cells so that the absorption capacity of the cell increases. The thickness of the thin film solar cell can thus be diminished with respect to that of solar cells on substrates without embossed pattern structures. As a result expensive semiconductor material is saved, the process of manufacturing the solar cells is accelerated and in the case of use of amorphous silicon modules it is possible to achieve a reduction in the light induced ageing of the cells and with that greater stabilised efficiency.

In a preferred version the rolled substrate may exhibit a barrier layer on the substrate surface to be coated, said barrier layer being a galvanic metal or metal oxide layer, or a layer of $Si_xN_y$, SiC or ZnO the thickness of which is from 100 nm to 5 $\mu$m. A preferred metal oxide layer is e.g. a layer of aluminium oxide prepared by anodising.

In the case of a large area single module the barrier layer may be in the form of a conductive material (e.g. ZnO); in the case of a conventional series arrangement of individual cells, an insulating layer must be provided between the actual module and the substrate (e.g. sol-gel or enamel layer).

In the following text we consider sol-gel layers to be layers that are produced by a sol-gel process.

In a further preferred version the rolled substrate may exhibit a sol-gel or enamel layer as barrier layer on the surface to be coated. The thickness of such a barrier layer is e.g. 0.5 to 250 $\mu$m, usefully 1 to 200 $\mu$m, and preferably 1 to 500 $\mu$m.

The sol-gel layers have a glass-like character and besides the substrate's own barrier layer may be deposited between the actual cells also as front face (insulating) closure of the cell from the influence of weathering and fluids (acid rain, birds droppings etc.) which promote corrosion. The resistance to hailstones is provided as a result of the compact composite of sol-gel layer cell substrate.

The sol-gel layers made using a sol-gel process may on the one hand act as a barrier layer between substrate and cell; on the other hand, by applying substances reflecting infra-red radiation in combination with the conductive ZnO back contact, they may be used as a means of reflecting infra-red radiation. As a result it is possible to save the silver layer which is otherwise employed.

White (infra-red-reflecting) coloured enamel layers may on the one hand act as barrier layers between substrate and cell, on the other hand, by applying substances reflecting infra-red radiation in combination with the conductive ZnO back contact, they may be used as a means of reflecting infra-red radiation. As a result it is possible to save the silver layer which is otherwise employed. In addition to the layer of enamel, a transparent contactive oxide layer of ZnO, ITO (Indium-Tin-Oxide) or $SnO_2$ can be provided.

In order to improve the adhesive properties of sol-gel or enamel layers and to prevent time and temperature dependant diffusion of constituents of the barrier layer into the aluminium substrate or from the aluminium substrate into the barrier layer, the aluminium substrate may be anodised prior to coating. In that connection, the oxide layers formed preferably form an isotropic barrier layer with a thickness of 0.01 to 0.5 $\mu$m having a dielectric constant of 5 to 10. The isotropic barrier layer represents thereby a pore-free oxide layer and exhibits high resistance to elevated temperatures and increased chemical resistance with respect to aluminium or aluminium alloys. Such an isotropic barrier layer prevents or diminishes e.g. any diffusion of adhesion inhibitors at the interface aluminium substrate/sol-gel or enamel layer.

An additional 0.1 to 10 $\mu$m thick porous oxide layer may lie on the outer surface of the isotropic barrier layer. Foreseen thereby are in particular pores which are open towards the surface. A layer thickness of 0.1 to 2 $\mu$m is preferred for the porous oxide layer. The pores preferably have a diameter of 0.03 to 0.15 $\mu$m and a ratio of pore depth to pore diameter of usefully $10^8$ to $10^{12}$ pores/cm$^2$, preferably between $10^9$ and $10^{11}$ pores/cm$^2$.

Sol-gel layers contain e.g. polymerisation products of organic substituted alkoxysiloxanes having the general formula

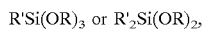
R'Si(OR)$_3$ or R'$_2$Si(OR)$_2$, where R and R' signify a nyamic radical. In another version the sol-gel layer may be a polymerisation product of organically substituted alkoxy compound having the general formula

X$_n$AR$_{4-n}$ where A signifies Si, Ti, Zr or Al, X signifies HO—, Alkyl-O— or Cl—, R signifies phenyl, alkyl, vinyl, vinylester or epoxyether and n represents a number 1, 2 or 3. Examples of phenyls are unsubstituted phenyl, for alkyl the same methyl, ethyl, propyl, iso-propyl, n-butyl, iso-butyl, pentyl etc., for —CH=CH$_2$, for —(CH$_2$)$_3$—O—C(=O)—C(—CH$_3$)=CH$_2$ and for (CH$_2$)$_3$—O—CH$_2$—CH=CH$_2$.

The sol-gel layers are usefully deposited directly or indirectly onto the aluminium substrate by means of a sol-gel process. For that purpose, e.g. alkoxides and halogen silanes are mixed and, in the presence of water and suitable catalysts, hydrolised and condensed. After removing the water and solvent a sol which forms is deposited on the substrate by means of immer-sion, centrifuging, spraying etc. where it transforms into a film of gel e.g. under the influence of temperature and/or radiation. As a rule silanes are employed to form the sol; it is also possible to replace the silanes partially by compounds which instead of silicon contain titanium, zirconium or aluminium. This way it is possible to vary the hardness, density and refractive index of the sol-gel layer. The hardness of the sol-gel layer can also be controlled by using different silanes, e.g. by forming an inorganic network to control the hardness and thermal stability or by using an organic network to control the elasticity. A sol-gel layer which can be classed between the inorganic and organic polymers can be deposited on the aluminium substrates via the sol-gel process by selective hydrolysis and condensation of alk-oxides, mainly those of silicon, aluminium, titanium and zirconium. As a result of the process an inorganic network is built up and, via appropriately derivitised silicic acid esters, it is possible to build up additional organic groups which may be used for functionalising and forming defined organic polymer systems. Further, the sol-gel film may also be deposited by electro-immersion coating according to the principle of cataphoretic precipitation of an amine and organically modified ceramic.

The enamel layers have a melting point in the range of 480° C. up to or close to the melting point of the aluminium substrate. By close to the melting point is meant temperatures of 20 or 10° C. below the melting point of the aluminium substrate. Suitable enamel layers are those based on alkali-silico-titanates, if desired with additions that lower the stoving temperature e.g. compounds such as oxides of lithium, barium, antimony, cadmium, bismuth or vanadium. Preferred are enamel layers from a frit containing the oxides of silicon in amounts of 27–33 wt. %, preferably 30 wt. %, of calcium, 9–12 wt. %, preferably 9.5–11.5 wt. %, of titanium, 18–22 wt. %, preferably 20–22 wt. %, of sodium, 18–22 wt. %, preferably 20–22 wt. %, of aluminium, 0.5 to 3.2 wt. %, preferably 2.8–3.2 wt. %, of lithium, 3.5–4.2 wt. %, preferably 3.8–4.2 wt. %, of boron, 5–8 wt. %, preferably 6.5–8 wt. %, of zirconium, 0.05–3 wt. %, preferably 2.3–3 wt. %, of zinc, 0.8–2.0 wt. %, preferably 0.8–1.5 wt. %, of magnesium, 1–1.5 wt. %, of calcium, 0–5 wt. %, of antimony, 0–2.8 wt. %, of strontium, 0–1.5 wt. %, and phosphorous, 0–2.5 wt. %.

Preferred are enamel layers which are deposited as with additions a frit onto the surface and, by means of heat treatment or stoving, are converted into a layer of enamel having a thickness of 50 to 200 μm, preferably 50 to 120 μm, in particular 70 to 100 μm. The layer of enamel may e.g. be produced from a mixture of oxides having the above mentioned ratios of constituents. As a rule the oxides are present in the form of frits i.e. as a mixture which has been ground. These frits may also contain processing additives such as e.g. boric acid, sodium meta-silicate, potassium hydroxide, titanium dioxide and pigments. Typical examples of a frit composition contains: 100 parts frit, about 4 parts boric acid, one part sodium meta-silicate, one part potassium hydroxide, five to fifteen parts titanium dioxide and one to seven parts pigment. The enamelling may e.g. comprise one layer, whereby a layer of frit composition is deposited on the substrate surface and stoved in a heat treatment operation i.e. transformed to a layer of enamel. It is possible, however, to have two layers deposited in two stoving operations, three layers in three stoving operations or several layers in several stoving operations. Other methods for depositing enamel layers consist of depositing two or more layers of frit or frit compositions in only one stoving operation. The frit may e.g. have an average particle size of less than 74 μm, usefully less than 44 μm. The frits may be deposited by scattering, spraying, immersion, or slurry deposition. Further possibilities are electrostatic spraying or electrophoresis. In some cases in which a suspension agent is employed, the frit must be dried. After drying, the coated substrate can be placed in a stoving furnace in which the stoving operation may be carried out continuously or in stages. Typical stoving times are in the range of 3 to 10 minutes. Typical stoving temperatures are between 480 and 560° C. The stoving operation may be performed in stages or continuously.

Substrates according to the invention having a barrier layer of gel or enamel exhibit an extremely smooth surface. Such barrier layers protect the substrate from the harmful influence of mechanical, physical, chemical and actinic effects and for example to a large extent from environmental effects. The surface is smooth, shiny and very hard.

The barrier layer on substrates according to the invention serves as a barrier to diffusion and/or as electrically insulating layer.

In a further preferred version the barrier layer exhibits at least in part an embossed structure on its free surface. The embossed structure may be decorative in appearance or it may be made such that it is possible to deflect reflected incident electromagnetic radiation, in particular light, in a predetermined direction. The shape of this embossed structure corresponds preferably with that of the previously described embossed structure on aluminium substrate surfaces.

The production of the embossed structure takes place e.g. by embossed rolling, whereby a roll with a desired embossed pattern is employed. In the case of sol-gel or enamel barrier layers embossing of the surface is carried out preferably with the barrier layer in a semi-solid state i.e. the embossing operation is carried out in the case of enamel layers as an intermediate step in the process during the stoving and in the case of sol-gel layers when these are in a partially hardened condition.

The substrate according to the invention is employed preferably for manufacturing thin film solar cells out of amorphous or poly or micro-crystalline silicon. Highly preferred is for such thin film solar cells to be deposited on facade elements. At elevated temperatures, e.g. under strong sunlight, solar cells normally exhibit a loss of efficiency. In the case of semiconductor materials a-Si and $\mu$-Si (poly or micro-crystalline) this is, however, much less pronounced than with monocrystalline silicon solar cells and e.g. in an a-Si:H is typically 0.1%/° K. This means that when employing such solar cells on facade panels, it is not necessary to provide circulation of air behind the panels in order to maintain the efficiency of the cells. This loss of efficiency must not be understood as having to do with limiting the lifetime of a solar cell or photovoltaic modules. Effects limiting the service life of such solar cells are exclusively corrosion as a result of poor sealing of the photovoltaic modules and interdiffusion of contact materials in the solar cell.

The deposition of the semiconductor film of amorphous, hydrated silicon and/or of an alloy of amorphous, hydrated silicon on the substrate according to the invention is performed preferably in a plasma chamber containing at least one pair of electrodes and is coupled to an electric high frequency generator, whereby the substrate is connected to a first electrode and a distance away from that electrode there is a second electrode and a gas containing at least one silicon compound is introduced into the plasma chamber, and a plasma created between the two electrodes by applying high frequency electric current with a frequency of 10 to 150 MHz.

For precipitation of the semiconductor film the distance between the substrate according to the invention and the second electrode is preferably 1–3 cm. Also preferred is for the ratio of the frequency and the distance of the substrate from the second electrode id between 30 and 80 MHz/cm. Highly preferred is for the frequency to lie between 30 and 100 MHz and the distance of the substrate from the second electrode to be 1–1.25 cm. The ratio of the electrical energy emitted in the plasma—measured at the clamps of both electrodes—and the plasma volume available between the electrodes is preferably between 0.02 and 0.2 W/cm$^3$. The plasma deposition of the semiconductor film is preferably at a pressure of 10 to 50 Pa, whereby the substrate temperature is usefully kept at 150 to 350° C. The gas introduced into the plasma chamber preferably contains silanes or disilanes and/or higher order silanes or silicon tetrafluoride, or hydrogen, or mixtures of these substances. The silane gas is introduced at a throughput rate of 0.3 to 2.0 sccm (cm$^3$ NTP/min) per liter of useable space in the plasma chamber and preferably around 1.2 sccm/liter. The gas introduced into the plasma chamber may contain further substances such as e.g. germanium, hydrogen, argon, germanium tetrafluoride, methane, carbon tetrafluoride, nitrogen, ammonia, phosphines or diboranes.

Highly preferred is the precipitation of a semiconductor film of an alloy of silicon and nitrogen. In that case the gas introduced into the plasma chamber comprises a mixture of silanes and ammonia in a volume ration of 0.03 to 0.3, and the distance of the substrate according to the invention from the second electrode is 1 to 3 cm.

The process-related objective is solved by way of the invention in that the substrate surface to be coated is exposed to a chemical brightening process or a plasma etching process. Plasma etching includes plasma etching with radicals which react with the surface and form gaseous components, or physical plasma etching (sputtering off), whereby the surface is removed as a result of bombardment with e.g. Argon ions.

Commercially available aluminium alloys often contain nucleants such as e.g. titanium diboride. Such nucleants normally produce a grain structure on the surface which is usually sharp edged and, after alkaline or acidic cleaning of the surface, leads to trough-shaped recesses around the grain. Such recesses can as a rule not be covered over satisfactorily by plasma deposited layers. As result local short circuiting can occur between the back and front contact.

Before depositing thin films, the sharp edged grains are, therefore, according to the invention rounded off e.g. by ion bombardment in an Ar-plasma. Further, such a treatment provides better thermal contact between such a grain structure and the substrate material, as a result of which the interdiffusion of coating material and substrate material during the coating process is reduced.

In general metals exhibit a polycrystalline structure. As a result of the Ar-ion bombardment of the substrate surface during the physical plasma etching process, the metal surfaces obtain an essentially amorphous structure. In turn, such amorphous substrate surfaces result in low interdiffusion behaviour.

Bombarding the aluminium substrate surface with high energy, heavy argon ions in a plasma process leads therefore to an amorphous substrate surface and to rounding off of the sharp-edged, grain structure at the surface of the substrate.

Another preferred process for preventing sharp edged recesses is according to the invention to clean the surface using a chemical plasma etching process in an atmosphere which does not attack the substrate surface to be coated chemically. Specially preferred for that purpose is an atmosphere of $O_2$—, $SF_6$, $O_2/SF_6$, $CF_4$—, $O_2/CF_4$— or $BCL_3$.

Also preferred is a process in which the substrate exhibits a barrier layer, the thickness of which is selected such that the local irregularities present are completely covered over by this barrier layer, and namely such that there is no longer any sharp edged irregularities present. Suitable for that purpose are in particular ZnO, SiN, SiC and sol-gel layers deposited in a sol-gel process, and enamels. Such layers exhibit an extremely smooth surface and at the same time act as good barrier layers against diffusion and as insulating layers.

The process according to the invention is effective in reducing the interdiffusion of substrate elements and thin film coating elements, and makes it possible to cover irregularities completely by the thin film coating. As a result it is possible to deposit less expensive diffusion barriers and insulating layers, whereby such barrier layers produce a further effect by rounding off irregularities on the substrate surfaces.

What is claimed is:

1. A coating substrate for thin-film coatings used in manufacturing electronic components, said coating substrate comprising a rolled product of one of aluminum and aluminum alloy, the substrate having a surface to be coated which exhibits local irregularities formed as one of small holes, small-grained elements and needle shaped elements, all local irregularities on the substrate surface to be coated having a maximum extension, measured vertically to the substrate surface, of less than 10 $\mu$m and more than 0.1 $\mu$m are formed so that flanks of the local irregularities are exposable completely to material deposition impinging on the substrate surface in a perpendicular manner, the maximum extension of each local irregularity, measured parallel to the substrate surface, is at least equal to a corresponding extension in a vertical direction, thereby avoiding defects in the electronic components.

2. A coating substrate according to claim 1, wherein the local irregularity has a peak-shaped part with a radius of curvature greater than 0.2 µm.

3. A coating substrate according to claim 1, wherein the rolled product is of pure aluminum of purity 98.3 to 99.98 wt. % Al.

4. A coating substrate according to claim 1, wherein the rolled product is made of an aluminum-based alloy.

5. A coating substrate according to claim 1, wherein the rolled product is a composite material having at least one outer layer of one of pure aluminum and an aluminum alloy, wherein the outer layer has a surface which is the substrate surface to be coated.

6. A coating substrate according to claim 1, wherein the substrate surface to be coated has an embossed structure, individual elements of the embossed structure having a depth of 1 nm to 1 mm, a largest dimension of the individual elements of the embossed structure measured parallel to the substrate surface being 1 nm to 5 mm.

7. A coating substrate according to claim 6, wherein the embossed structure has a non-symmetrical pattern with V-shaped troughs, each V-shaped trough being configured to have a steep flank and a flat flank so that the steep flank forms an angle of 2 to 20° with respect to surface normals over the entire substrate surface, and the flat flank forms an angle of 20 to 70° with respect to the surface normals.

8. A coating substrate according to claim 1, and further comprising a barrier layer on the substrate surface, the barrier layer being one of a galvanic metal layer, a metal oxide layer, and a layer of one of $Si_xN_y$, SiC and ZnO having a thickness of 100 nm to 5 µm.

9. A coating substrate according to claim 8, wherein the barrier layer has an embossed structure with individual elements having a depth of 1 nm to 0.8 mm, a largest dimension of the individual elements of the embossed structure measured parallel to the substrate surface being 1 nm to 1 mm.

10. A coating substrate according to claim 1, and further comprising a barrier layer on the substrate surface, the barrier layer having a thickness of 0.5 to 250 µm and being one of a sot-gel layer and an enamel layer.

11. A coating substrate according to claim 10, wherein the barrier layer has an embossed structure with individual elements having a depth of 1 nm to 0.8 mm, a largest dimension of the individual elements of the embossed structure measured parallel to the substrate surface being 1 nm to 1 mm.

12. A coating substrate according to claim 1, and further comprising at least one thin film solar cell arranged on the substrate surface, the solar cell being of one of amorphous and microcrystalline silicon, the thin-film solar cell having an n-i-p structure which features an additional protective layer of a conductive oxide on a side facing light.

13. A coating substrate according to claim 12, wherein the conductive oxide of the additional protective layer is ZnO.

14. A coating substrate according to claim 12, and further comprising an infrared reflecting mirror layer of silver/zinc oxide.

15. A coating substrate according to claim 12, and further comprising a mirror layer of white infrared reflecting enamel and a Transparent Contactive Oxide layer.

16. A coating substrate according to claim 15, wherein the transparent contactive oxide layer is one of ZnO, ITO (Indium-Tin-Oxide) and $SnO_2$.

17. A coating substrate according to claim 12, and further comprising a sol-gel layer between the substrate surface and the thin-film solar cell, the sol-gel layer having infrared reflecting properties, the infrared reflecting properties being effected by one of infrared reflecting particles and substances embedded in the sol-gel layer.

18. A coating substrate according to claim 12, and further comprising a protective sol-gel layer on the side of the protective layer of conductive oxide on the thin-film solar cell facing the light.

19. A process for manufacturing a coating substrate for thin-film coatings used in manufacturing electronic components, said coating substrate comprising a rolled product of one of aluminum and aluminum alloy, the substrate having a surface to be coated which exhibits local irregularities formed as one of small holes, small-grained elements and needle shaped elements, all local irregularities on the substrate surface to be coated having a maximum extension, measured vertically to the substrate surface, of less than 10 µm and more than 0.1 µm are formed so that flanks of the local irregularities are exposable completely to material deposition impinging on the substrate surface in a perpendicular manner, the maximum extension of each local irregularity, measured parallel to the substrate surface, is at least equal to a corresponding extension in a vertical direction, thereby avoiding defects in the electronic components, the process comprising the step of subjecting the aluminum surface to be coated to chemical plasma etching in an atmosphere which does not chemically attack the substrate surface to be coated.

20. A process according to claim 19, wherein the step of subjecting the aluminum surface to chemical plasma etching includes subjecting the surface to chemical plasma etching in one of an $O_2$, $SF_6$, $O_2/SF_6$, $CF_4$, $O2/CF_4$ and $BCl_3$ atmosphere.

21. A process according to claim 19, including coating the substrate surface with a structured sol-gel protective layer.

22. A process for manufacturing a coating substrate for thin-film coatings used in manufacturing electronic components, said coating substrate comprising a rolled product of one of aluminum and aluminum alloy, the substrate having a surface to be coated which exhibits local irregularities formed as one of small holes, small-grained elements and needle shaped elements, all local irregularities on the substrate surface to be coated having a maximum extension, measured vertically to the substrate surface, of less than 10 µm and more than 0.1 µm are formed so that flanks of the local irregularities are exposable completely to material deposition impinging on the substrate surface in a perpendicular manner, the maximum extension of each local irregularity, measured parallel to the substrate surface, is at least equal to a corresponding extension in a vertical direction, thereby avoiding defects in the electronic components, the process comprising the step of subjecting the aluminum surface to be coated to a physical plasm etching process in an inert atmosphere.

23. A process according to claim 22, wherein the step of subjecting the aluminum surface to physical plasma etching includes subjecting the aluminum surface to physical plasma etching in one of an Ar, an $N_2$ and an $H_2$ atmosphere.

24. A process according to claim 22, including coating the substrate surface with a structured sol-gel protective layer.

25. A photovoltaic facade element comprising a coating substrate for thin-film coating, said coating substrate comprising a rolled produce of one of aluminum and aluminum alloy, the substrate having a surface to be coated which exhibits local irregularities formed as one of small holes, small-grained elements and needle shaped elements, all local irregularities on the substrate surface to be coated having a maximum extension, measured vertically to the substrate surface, of less than 10 μm and more than 0.1 μm are formed so that flanks of the local irregularities are exposable completely to material deposition impinging on the substrate surface in a perpendicular manner, the maximum extension of each local irregularity, measured parallel to the substrate surface, is at least equal to a corresponding extension in a vertical direction, thereby avoiding defects in the electronic components.

* * * * *